United States Patent [19]
Lee

[11] Patent Number: 6,107,201
[45] Date of Patent: Aug. 22, 2000

[54] ALUMINUM SPIKING INSPECTION METHOD

[75] Inventor: Ching-Ying Lee, Chu-Tung, Taiwan

[73] Assignee: Vanguard International Semiconductor Corporation, Hsin-Chu, Taiwan

[21] Appl. No.: 08/430,467

[22] Filed: Apr. 28, 1995

[51] Int. Cl.[7] ........................... H01L 21/66; H01L 21/44; H01L 21/461

[52] U.S. Cl. .............................. 438/688; 438/14; 438/16; 438/17; 438/754; 438/756

[58] Field of Search .................................. 437/7, 8, 194, 437/197, 198, 199; 156/626.1

[56] References Cited

U.S. PATENT DOCUMENTS

| | | | |
|---|---|---|---|
| 4,120,744 | 10/1978 | Payne et al. ............................. | 156/653 |
| 4,429,453 | 2/1984 | Hauck et al. ............................ | 437/187 |
| 4,542,579 | 9/1985 | Poponiak et al. ....................... | 437/944 |
| 4,767,497 | 8/1988 | Shattes et al. .......................... | 216/104 |
| 4,999,160 | 3/1991 | Lowry et al. ........................... | 437/197 |
| 5,047,367 | 9/1991 | Wei et al. ................................ | 437/200 |
| 5,143,855 | 9/1992 | Pace et al. ................................. | 437/3 |

OTHER PUBLICATIONS

S. Wolf, "Silicon Processing For The VLSI Era, vol. I", Lattice Press, 1986 pp. 531–533.
S. Wolf "Silicon Processing For The VLSI Era, vol. II", Lattice Press, 1990, pp. 101–102.
S. Wolf et al "Silicon Processing, for the VLSI Era, vol. I", Lattice Press, 1986, pp. 589–590.
VLSI Technology by S.M. Sze, Second Edition, Pub. by McGraw Hill in 1988, p. 226.

*Primary Examiner*—John F. Niebling
*Assistant Examiner*—Ha Tran Nguyen
*Attorney, Agent, or Firm*—George O. Saile; Stephen B. Ackerman; Alek P. Szecsy

[57] ABSTRACT

A method for inspection which involves the complete and sequential removal of an aluminum containing metallization layer, and other metal and insulator layers, from the surface of a silicon substrate. The layers are removed through sequential chemical etch processes tailored specifically to the composition of the individual layers. Upon removal of all layers, the surface of the silicon substrate is etched in a buffered aqueous etchant solution. The surface of the silicon substrate may then be inspected with the aid of an optical microscope to determine level to which the aluminum containing metallization layer has spiked into the silicon substrate.

15 Claims, 3 Drawing Sheets

ALUMINUM SPIKING INSPECTION METHOD

BACKGROUND OF THE INVENTION

1. Field of the Invention

The present invention relates to a simple chemical method for inspection for the presence of aluminum spiking into silicon substrates such as semiconductor device contact regions. The method requires neither cross-sectioning of the silicon substrate nor the use of a scanning electron microscope to inspect the silicon substrate into which aluminum spiking might occur.

2. Description of Related Art

Semiconductor devices are electrical circuit switching and control devices typically fabricated of microscopic dimensions. These devices are most commonly constructed beneath and upon the surface of a high puritan silicon wafer.

Through various etching, masking, deposition and implanting techniques, discrete portions of the silicon wafer substrate may be transformed into regions of varying electrical conductivity and polarity. The regions so formed may encompass the range of electrical conductivities including highly insulating, semiconducting and highly conducting. Through appropriate physical arrangement of regions of varying electrical conductivity and polarity, there may be formed upon the silicon wafer substrate transistors, diodes, resistors and other electrical circuit elements.

In order for these individual circuit elements to perform a desired electrical circuit function, they must be linked through the use of a conductive metal interconnection. In practice, conductive metal interconnections in the art are formed from metal layers which are deposited onto the silicon wafer substrate under vacuum and subsequently patterned to yield conductive metal lines which interconnect the individual circuit elements of interest.

The most common metal layers used in the art for formation of the conductive metal lines which interconnect circuit elements are aluminum and aluminum alloy layers. Aluminum and aluminum alloys provide excellent electrical conductivity. However, aluminum and aluminum alloys suffer from the undesirable characteristic of nonuniform inter-diffusion at the point of contact to a silicon substrate such as a semiconductor device contact region.

This nonuniform inter-diffusion may progress to a point where multiple slender intrusions of an aluminum layer penetrate from the aluminum layer into the silicon substrate or semiconductor device contact region upon which the aluminum layer was deposited. Under such conditions, the nonuniform diffusion of the aluminum layer into the silicon substrate is referred to as aluminum spiking.

In order to limit aluminum spiking into silicon substrates such as semiconductor device contact regions, it is common in the art to first deposit a barrier metal layer onto the silicon substrate prior to forming an aluminum layer onto that region. Several metals have been found to be useful as barrier metals layers for silicon substrates. Platinum and titanium are two common barrier metals; other barrier metals are well known in the art. Upon heating, many barrier metal layers form metal silicides with the silicon substrate surface upon which they were deposited.

Notwithstanding the presence of a barrier metal layer or metal silicide beneath an aluminum metal layer formed upon a silicon substrate, the aluminum may nonetheless still penetrate and spike through that barrier metal layer into the silicon substrate. Within the context of semiconductor devices, the consequences of this spiking are typically the formation of a high conductivity pathway of the aluminum spike through a lower conductivity semiconductor device contact region. The high conductivity aluminum spike pathway will often lead to electrical performance or reliability problems within the semiconductor device.

Since aluminum spiking is a well known phenomenon which limits the production of fully functional or reliable semiconductor devices, it is routine in the art of semiconductor manufacturing to inspect semiconductor devices for the presence of aluminum spiking. The most common method used for the inspection for aluminum spiking begins with cross-sectioning a semiconductor device in a fashion which reveals the multi-layer structure comprising: (1) the aluminum containing metallization layer, (2) the underlying barrier metal layer, and (3) the semiconductor device contact region within the semiconductor substrate.

When cross-sectioned in this fashion, it is often possible to observe with a Scanning Electron Microscope (SEM) those portions of the aluminum containing metallization layer which have spiked through the barrier metal layer and protruded into the underlying semiconductor device contact region. The aluminum spikes are easily discernable through this SEM technique if the cross-sectioning of the sample is properly accomplished and if the cross-section was incident upon an area within the semiconductor device contact region through which an aluminum spike protruded.

Although the cross-sectioning of semiconductor device structures to discern the presence of aluminum spiking is a common and straightforward technique, it has several limitations. The first limitation is the substantial expense for the SEM hardware used for analysis of cross-sectioned semiconductor devices. Significant additional limitations which merit discussion derive from inherent limitations of the cross-sectioning technique itself.

The ability to cleanly and reproducibly cross-section a semiconductor device is clearly very important to determining the level of aluminum spiking in that cross-sectioned device. Since aluminum is a malleable metal, it is possible when cross-sectioning a semiconductor device that the aluminum metal may smear or tear. Under such conditions, a cross-sectioned semiconductor device contact region may falsely suggest the presence of aluminum spiking.

The probability of encountering an aluminum spike during the cross-sectioning process is also very important in determining the level of aluminum spiking in a cross-sectioned semiconductor deice. For semiconductor devices having limited inherent probability of aluminum spike formation, substantial quantities of semiconductor device cross-sections may be needed in order to ascertain whether an aluminum spiking problem is contributing to semiconductor device reliability or functionality defects. Unfortunately, the amount of time, effort and resources needed to obtain multiple semiconductor device cross-sections may be quite significant.

Thus, from the foregoing it is desirable to provide a simple and efficient method for determining aluminum spiking into silicon substrates such as semiconductor device contact regions. Such a method should avoid the expense and uncertainty of conventional methods which employ a cross-sectioning of the silicon substrate followed by an SEM analysis of the cross-sectioned substrate.

SUMMARY OF THE INVENTION

A principal object of the present invention is to provide an economical method for determining aluminum spiking into silicon substrates such as semiconductor device contact regions, which method does not require the use of a scanning electron microscope.

Another object of the present invention is to provide an accurate method for determining aluminum spiking into silicon substrates such as semiconductor device contact regions, which method does not require silicon substrate cross-sectioning.

In accord with the objects of this invention, a new method for determining aluminum spiking into silicon substrates such as semiconductor device contact regions is described. The method entails providing a silicon substrate upon which is formed an aluminum containing metallization layer. The aluminum containing metallization layer is then etched completely from the silicon substrate. The silicon substrate is then etched in a buffered aqueous etchant solution comprising about 1.5 to about 2 parts by volume 10:1 buffered oxide etchant and about 1 part by volume 98% acetic acid. The silicon substrate is etched with the buffered aqueous etchant solution until the surface of the silicon substrate is gray in color. Subsequent to this etching, the silicon substrate surface upon which the aluminum containing metallization layer resided is inspected.

The present invention provides a simple and effective method for inspecting a silicon substrate for aluminum spiking. Since the method of the present invention provides for inspection of the surface of a silicon substrate after etching an aluminum containing metallization layer from that surface, the present invention does not require cross-sectioning of the silicon substrate. In addition, since the entire surface from which the aluminum containing metallization layer was etched is available for inspection, the present invention is not limited by the probability of cross-sectioning a silicon substrate in a region within that substrate through which an aluminum spike has protruded. Finally, the buffered aqueous etchant solution of the present invention provides an economical means for etching the surface of the silicon substrate to provide a surface having adequate contrast to view without the aid of a Scanning Electron Microscope the protruding ends of portions of the aluminum containing metallization layers which have spiked into the silicon substrate.

BRIEF DESCRIPTION OF THE DRAWINGS

The accompanying drawings, which form a material part of this description, show the following.

DESCRIPTION OF THE PREFERRED EMBODIMENT

The preferred embodiment of the present invention provides a chemical etch method for removing an aluminum containing metallization layer from the surface of a silicon substrate. The preferred silicon substrate upon which the present invention may be practiced is a semiconductor substrate having a semiconductor device contact region formed therein, and an aluminum containing metallization layer formed over the semiconductor device contact region.

The present invention may be practiced upon various types of semiconductor devices which have a semiconductor device contact region having an aluminum containing metallization layer formed thereon. The present invention nay be practiced upon resistor contacts, diode contacts, transistor contacts of all types, and any other type of semiconductor device contact region where an aluminum containing metallization layer adjoins a semiconductor substrate. The present invention may also be practiced upon a silicon substrate upon the surface of which is deposited an aluminum containing metallization layer, regardless of whether the silicon substrate is semiconducting. Finally, as will be clear from the description of the preferred embodiment, the present invention may also be practiced upon silicon substrates and semiconductor substrates which have multiple layers on their surfaces in addition to the aluminum containing metallization layer. Such additional layers include, but are not limited to barrier metal layers and silicon dioxide insulating layers.

Figure 1:
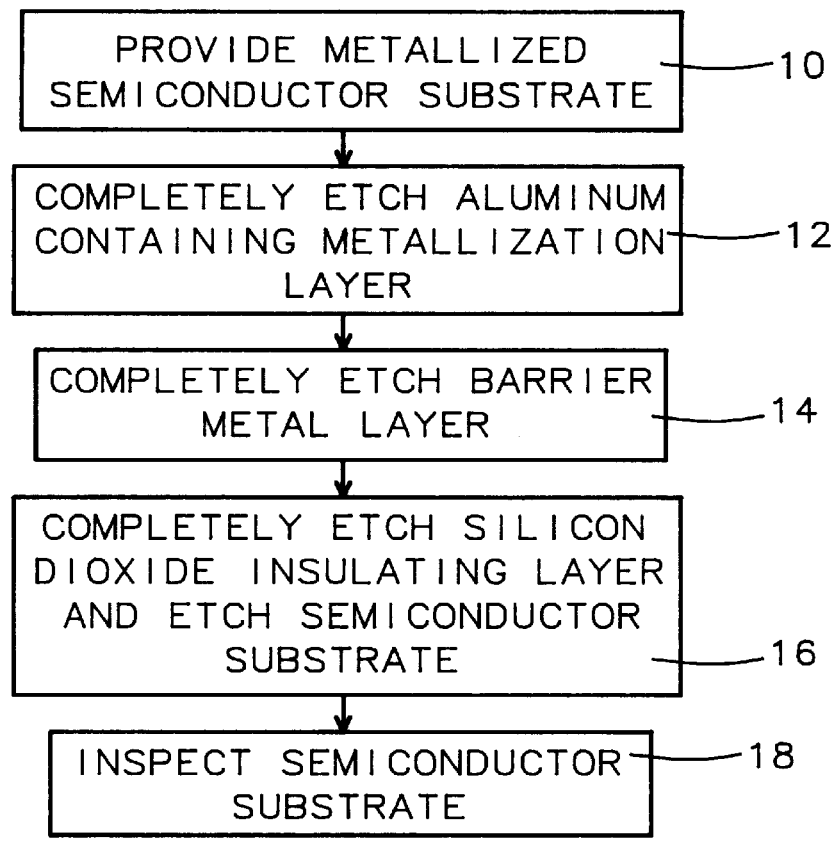
FIG. 1 shows the process steps in the preferred method for performing the aluminum spiking inspection of the present invention.

Referring to FIG. 1, there is shown the preferred process outline for practice of the aluminum spiking inspection of the present invention. Corresponding with FIG. 1 are the schematic diagrams of FIG. 2a to FIG. 2d which show cross-sectional schematic diagrams of a metallized semiconductor substrate, into which aluminum spiking has occurred, at progressive stages of the etch processes of the present invention.

Figure 2A:
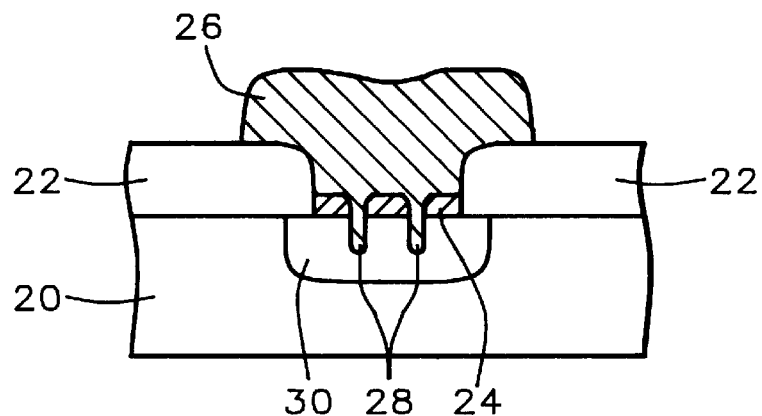
FIG. 2a to FIG. 2d show cross-sectional schematic diagrams of a semiconductor substrate in which aluminum spiking is present at the various stages of the preferred method of the present invention.

Step 10 of FIG. 1 requires a metallized semiconductor substrate in order to practice the present invention. A cross-sectional schematic diagram of such a semiconductor substrate is shown in FIG. 2a. In FIG. 2a, a semiconductor substrate 20 has a semiconductor device contact region 30 to which metallic contact is made. The semiconductor device contact region 30, which protrudes into the semiconductor substrate 20, is accessed through a window in a silicon dioxide insulating layer 22. Although many types of insulators are known in the art of semiconductor device fabrication, silicon dioxide is the preferred insulator upon which the present invention may be practiced. The typical thickness of the silicon dioxide insulating layer 22 of the present invention is about 0.6 to 1.0 microns.

Formed upon the semiconductor device contact region 30 is a thickness of a barrier metal layer 24. Common barrier metal layers are platinum, titanium, titanium/tungsten alloy and titanium nitride. Barrier layers may also be composed of the corresponding metal silicides which are formed by thermal treatment of a semiconductor substrate upon whose surface was deposited a silicide forming barrier metal layer 24.

The barrier metal layer 21 may be formed through several methods as are known in the art. Common methods to form the barrier metal layer 24 of the present invention include, but are not limited to metal evaporation methods and metal sputtering methods. The typical thickness of the barrier metal layer 24 of the present invention is about 1000 to about 1800 angstroms.

Formed upon the barrier metal layer 24 is an aluminum containing metallization layer 26. In addition to pure aluminum, the aluminum spiking inspection method of the present invention may also be practiced upon aluminum containing metallization layers derived from various types of aluminum alloys. Common types of aluminum alloys known in the art upon which the present invention may be practiced include aluminum-copper alloys and aluminumsilicon-copper alloys. Analogously to the barrier metal layer 24, the aluminum containing metallization layer 26 man also be formed through several methods as are known in the art. Such methods include, but are not limited to thermal evaporation processes, electron beam assisted evaporation processes and sputtering processes.

Finally, there is shown in FIG. 2a the presence of aluminum spikes 28. The aluminum spikes 28 are portions of the aluminum containing metallization layer 26 which protrude through the barrier metal layer 21 into the semiconductor device contact region 30 of the semiconductor substrate 20. The accurate, efficient and economical detection and quantifying of the aluminum spikes 28 is the goal to which the present invention is directed.

Figure 2B:
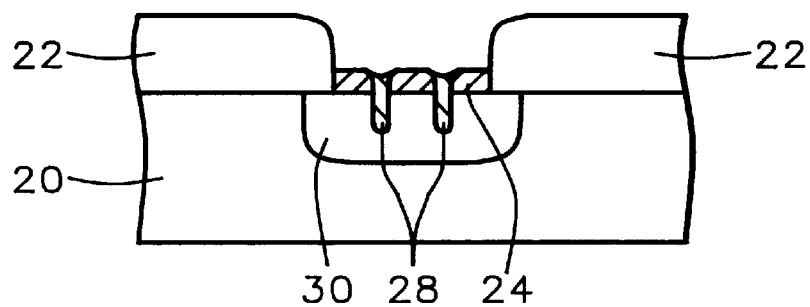
Figure 2C:
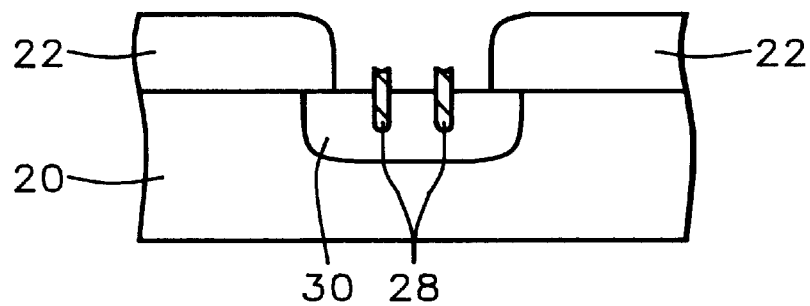

Referring again to FIG. 1, step 12 shows the first etching process in the preferred embodiment of the present invention. The first etching process removes the aluminum containing metallization layer 26 front the semiconductor device contact region 30 of the semiconductor substrate 20. FIG. 2b shows a cross-sectional diagram the semiconductor substrate 20 of FIG. 2a after this etching has occurred.

Etching of the aluminum containing metallization layer 26 may be accomplished through several methods as are known in the art. Such etch methods include, but are not limited to chemical etch methods, Reactive Ion Etch (RIE) methods and Magnetically Enhanced Reactive Ion Etch (MERIE) methods. For the present invention it is preferred to etch the aluminum containing metallization layer 26 with a chemical etch process. The preferred chemical etch composition for removing the aluminum containing metallization layer 26 is an acidic aqueous etchant solution. The acidic aqueous etchant solution is preferably comprised of about 2 to about 3 parts by volume 70% nitric acid, about 0.03 to about 0.06 parts by volume hydrofluoric acid and about 1 part by volume deionized water.

Etching of the aluminum containing metal layer 26 is done for a time sufficient to assure its complete removal. The aluminum containing metal layer 26 man be etched at room temperature. Alternatively, a more rapid etching of the aluminum containing metal layer 26 may be accomplished by heating the acidic aqueous etchant solution. Preferable, the aluminum containing metallization layer 26 is etched through exposure to the acidic aqueous etchant solution at about 20 C to about 100 C.

Referring again to FIG. 1, step 14 shows the barrier metal layer 21 etching which follows etching of the aluminum containing metallization layer 26. Corresponding to step 14 is FIG. 2c, which illustrates a cross-sectional schematic diagram of a semiconductor device contact region 30 from which the barrier metal layer 21 and the aluminum containing contact metallization layer 26 have been removed.

Similarly to the etching of the aluminum containing metallization layer 26, the etching of the barrier metal layer 24 may also be accomplished through several etch methods as are known in the art. Such methods include, but are not limited to chemical etch methods, RIE methods and MERIE methods. The removal of the barrier metal layer 24 of the present invention is preferably accomplished through contacting the barrier metal layer with a chemical etchant comprised of an alkaline aqueous etchant solution. The preferred composition of the alkaline aqueous etchant solution is about 0.4 to about 0.6 parts by volume 49% ammonium hydroxide and about 1 part by volume 30% hydrogen peroxide.

Analogously to etching of the aluminum containing metallization layer 24 through contact with the acidic aqueous etchant solution, the barrier metal layer 26 may also be etched more rapidly from the surface of the semiconductor device contact region 30 through contact of the barrier metal layer 24 with the alkaline aqueous etchant solution at elevated temperature. However, given the limited thickness of the barrier metal layer 24, and the volatility of the alkaline aqueous etch solution components, it is preferred to etch the barrier metal layer 24 from the surface of the semiconductor device contact region 30 by etching with the alkaline aqueous etchant solution at about room temperature. The barrier metal layer 24 is etched in the alkaline aqueous etchant solution for a time sufficient to completely remove the barrier metal layer 24.

Figure 2D:
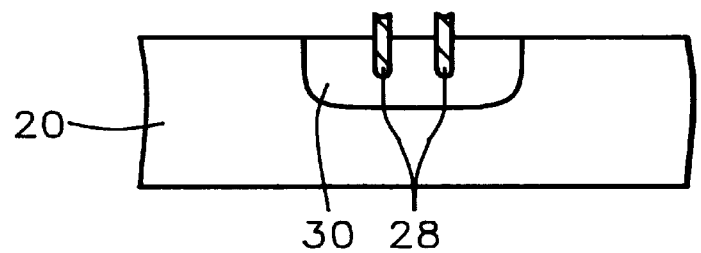

Referring again to FIG. 1, step 16 shows the last etching step of the preferred embodiment of the present invention. Step 16 shows the etching of the silicon dioxide insulating layer 22 from the semiconductor substrate 20 and the etching of the semiconductor substrate 20. Corresponding to step 16 is FIG. 2d, which shows a schematic cross-sectional diagram of the semiconductor substrate 20 after etching of the silicon dioxide insulating layer 22. FIG. 2d shows the slight protrusions of the aluminum spikes 28 above the surface of the semiconductor deice contact region 30.

Methods for etching of silicon dioxide insulating layers are well known in the art. Such methods include, but are not limited to chemical etching methods, RIE plasma etching methods and MERIE plasma etching methods. The silicon dioxide insulating layer 22 upon which is practiced the present invention is preferably etched through a chemical etching process utilizing a buffered aqueous etchant solution. The buffered aqueous etchant solution of the present invention is preferably comprised of about 1.5 to about 2.0 parts by volume 10:1 buffered oxide etchants and about 1 part by volume 98% acetic acid. Buffered oxide etchants are sell known in the art. They are comprised of mixtures of aqueous 40% ammonium fluoride solution and aqueous 49% hydrofluoric acid solution.

Analogously, to the prior etch steps of the present invention, the silicon dioxide insulating layer 22 may also be removed more rapidly from the surface of the semiconductor substrate 20 if the silicon dioxide insulating layer 22 is exposed to the buffered aqueous etchant solution at elevated temperature. The preferred conditions for etching the silicon dioxide insulating layer 22 of the present invention include exposure to the buffered aqueous etchant solution a temperature of about 20 C to about 100 C. The silicon dioxide insulating layer 22 is etched for a time sufficient to assure its complete removal.

Complete removal of the silicon dioxide insulating layer 22 will be indicated by a change of the surface of the semiconductor substrate 20 from a pink color to a gray color The presence of the gray color on the surface of the semiconductor substrate 20 subsequent to etching with the buffered aqueous etchant solution is important to the practice of the present invention. When the surface of the semiconductor substrate 20 exhibits a gray color, the semiconductor substrate 20 has been adequately etched to allow the simplified inspection technique of the present invention.

The final process step in the practice of the preferred embodiment of the present invention is shown as step 18 in FIG. 1 Step 18 shows the inspection of the semiconductor substrate 20 from which the metal and insulator layers have been removed. In contrast with the cross-sectioning methods of the prior art which require the use of SEMI analysis, the inspection method of the present invention may be undertaken through use of an optical microscope. Any optical microscope possessing sufficient magnifying strength to visualize the cross-sectional ends of aluminum spikes 28 may be used in the practice of this invention.

Many types of optical microscopes known in the art may be used in the practice of the present invention. Monocular and binocular microscopes are common in the art and easily applied in the practice of the present invention. In addition to microscopes, automated data recording and graphical data analysis systems may also be applied in the practice of this invention. Such systems may provide a convenient method for automatically quantifying aluminum spikes 28 formed within the semiconductor device contact region 30 of the semiconductor substrate 20.

Figure 3:
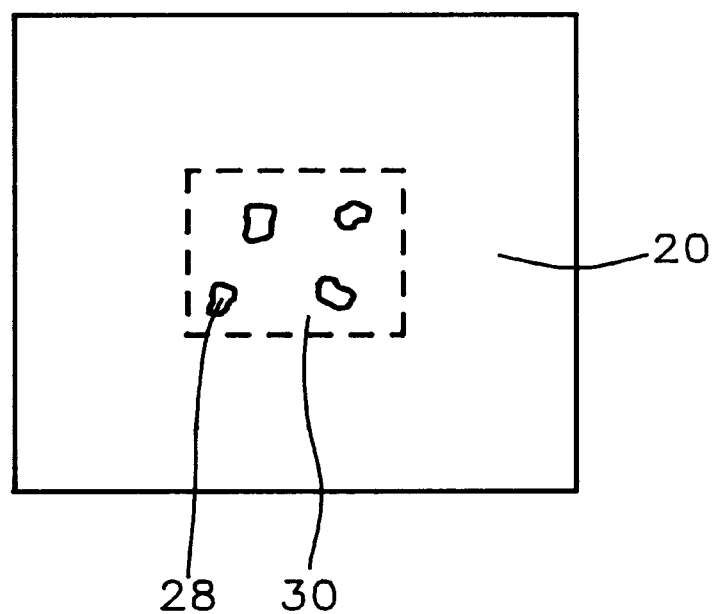
FIG. 3 shows a plan view schematic diagram of a semiconductor substrate upon which the etching processes of the present invention have been practiced.

A schematic diagram of a plan view of a semiconductor substrate 20 upon which has been practiced the present invention is shown in FIG. 3. FIG. 3 shows a semiconductor substrate 20 within which a semiconductor device contact region 30 has been formed. The exposed ends of aluminum spikes 28 are visible within the exposed semiconductor device contact region 30 subsequent to practice of the chemical etch processes of the present invention.

What is claimed is:

1. A method for inspecting a silicon substrate for aluminum spiking comprising:

providing a silicon substrate having an aluminum containing metallization layer formed on a surface of the silicon substrate;

etching the aluminum containing metallization layer completely from the surface of the silicon substrate;

etching the surface of the silicon substrate through contacting the surface of the silicon substrate with a buffered aqueous etchant solution comprising about 1.5 to about 2 parts by volume 10:1 buffered oxide etchant and about 1 part by volume 98% acetic acid;

the etching of the surface of the silicon substrate being undertaken until the surface of the silicon substrate is gray in color; and inspecting the surface of the silicon substrate.

2. The method of claim 1 wherein the aluminum containing metallization layer is etched completely from the silicon surface through contacting the aluminum containing metallization layer with an acidic aqueous etchant solution comprising:

about 2 to about 3 parts by volume 70% nitric acid;

about 0.03 to about 0.06 parts by volume 40% hydrofluoric acid; and about 1 part by volume deionized water.

3. The method of claim 2 wherein the aluminum containing metallization layer is contacted with the acidic aqueous etchant solution at a temperature of about 20 C to about 100 C.

4. The method of claim 1 wherein the surface of the silicon substrate is contacted with the buffered aqueous etchant solution at a temperature of about 20 C to about 100 C.

5. The method of claim 1 wherein the surface of the silicon substrate is inspected using an optical microscope.

6. A method for inspecting a silicon substrate for aluminum spiking comprising:

providing a silicon substrate having a barrier metal layer formed on a surface of the silicon substrate and an aluminum containing metallization layer formed over the barrier metal layer;

etching the aluminum containing metallization layer completely from the surface of the silicon substrate;

etching the barrier metal layer completely from the surface of the silicon substrate;

etching the surface of the silicon substrate through contacting the surface of the silicon substrate with a buffered aqueous etchant solution comprising about 1.5 to about 2 parts by volume 10:1 buffered oxide etchant and about 1 part by volume 98% acetic acid;

the etching of the surface of the silicon substrate being undertaken until the surface of the silicon substrate is gray in color; and inspecting the surface of the silicon substrate.

7. The method of claim 6 wherein the aluminum containing metallization layer is etched completely from the silicon surface through contacting the aluminum containing metallization layer with an acidic aqueous etchant solution comprising:

about 2 to about 3 parts by volume 70% nitric acid;

about 0.03 to about 0.06 parts by volume 40% hydrofluoric acid; and about 1 part by volume deionized water.

8. The method of claim 6 wherein the barrier metal layer is etched completely from the silicon surface through contacting the barrier metal layer with an alkaline aqueous etchant solution comprising:

about 0.4 to about 0.6 parts by volume 49% ammonium hydroxide; and about 1 part by volume 30% hydrogen peroxide.

9. A method for inspecting a semiconductor device contact region for aluminum spiking comprising:

providing a semiconductor substrate having formed thereon a silicon dioxide insulating layer having an opening formed therethrough accessing the surface of a semiconductor device contact region within the semiconductor substrate;

the surface of the semiconductor device contact region having formed thereon an aluminum containing metallization layer upon a barrier metal layer;

etching the aluminum containing metallization layer completely from the surface of the semiconductor device contact region;

etching the barrier metal layer completely from the surface of the semiconductor device contact region;

etching the silicon dioxide layer completely from the semiconductor substrate;

etching the surface of the semiconductor substrate through contacting the surface of the semiconductor substrate with a buffered aqueous etchant solution comprising about 1.5 to about 2 parts by volume 10:1 buffered oxide etchant and about 1 part by volume 98% acetic acid;

the etching of the surface of the semiconductor substrate being undertaken until the surface of the semiconductor substrate is gray in color; and inspecting the surface of the semiconductor substrate.

10. The method of claim 9 wherein the aluminum containing metallization layer is formed from a metal chosen from the group consisting of aluminum, aluminum-copper alloy and aluminum silicon-copper alloy.

11. The method of claim 10 wherein the aluminum containing metallization layer is etched completely from the surface of the semiconductor device contact region through contacting at a temperature of about 20 C to about 100 C the aluminum containing metallization layer with an acidic aqueous etchant solution comprising:

about 2 to about 3 parts by volume 70% nitric acid;

about 0.03 to about 0.06 parts by volume 40% hydrofluoric acid; and about 1 part by volume deionized water.

12. The method of claim 9 wherein the barrier metal layer is formed from a layer chosen from the group of layers consisting of platinum, titanium, titanium nitride and titanium tungsten alloy layers.

13. The method of claim 12 wherein the barrier metal layer is etched completely from the surface of the semiconductor device contact region through contacting at a temperature of about 20C to about 100 C the barrier metal layer with an aqueous alkaline etchant solution comprising:

about 0.4 to about 0.6 parts by volume 49% ammonium hydroxide; and about 1 part by volume 30% hydrogen peroxide.

14. The method of claim 9 wherein the silicon dioxide insulating layer surface is etched completely from the semiconductor substrate through contacting at a temperature of about 20 C to about 100 C the silicon dioxide insulating layer with a buffered aqueous etchant solution comprising:

about 1.5 to about 2 parts by volume 10:1 buffered oxide etchant; and about 1 part by volume 98% acetic acid.

15. The method of claim 9 wherein the semiconductor device contact region is inspected with an optical microscope.

* * * * *